United States Patent [19]
Fransen et al.

[11] Patent Number: 5,841,216
[45] Date of Patent: Nov. 24, 1998

[54] COMPOSITE PIEZOELECTRIC MULTILAYER ELEMENT AND METHOD OF MANUFACTURING SUCH AN ELEMENT

[75] Inventors: Benedictus C. H. Fransen; Bauke Oppedijk; Henricus A. C. Didden, all of Roermond, Netherlands

[73] Assignee: U.S. Philips Corporation, New York, N.Y.

[21] Appl. No.: 784,674

[22] Filed: Jan. 21, 1997

[30] Foreign Application Priority Data

Jan. 18, 1996 [EP] European Pat. Off. .............. 96200122

[51] Int. Cl.⁶ ..................................................... H01L 41/04
[52] U.S. Cl. .......................... 310/328; 310/359; 310/346
[58] Field of Search ..................................... 310/328, 331, 310/358, 359, 346

[56] References Cited

FOREIGN PATENT DOCUMENTS

0448349A2  9/1991  European Pat. Off. ......... B41J 2/295

*Primary Examiner*—Mark O. Budd
*Assistant Examiner*—Timothy A. Williams
*Attorney, Agent, or Firm*—Daniel E. Tierney

[57] ABSTRACT

The invention relates to a composite piezoelectric multilayer element of which, in operation, only a part is piezoelectrically active, and to a method of manufacturing such an element. In accordance with the invention, the piezoelectrically inactive part has larger dimensions in one or more directions than the part which, in operation, is piezoelectrically active when a voltage is applied across the electric connections of the element. Moreover, the inactive part is built up of ceramic foils and electrode layers whose thickness and composition correspond to the thickness and composition of the part of the element which, in operation, is piezoelectrically active. The element in accordance with the invention can be manufactured in a simple and inexpensive manner.

4 Claims, 1 Drawing Sheet

COMPOSITE PIEZOELECTRIC MULTILAYER ELEMENT AND METHOD OF MANUFACTURING SUCH AN ELEMENT

BACKGROUND OF THE INVENTION

The invention relates to a composite piezoelectric multilayer element of which, in operation, only a part is piezoelectrically active, as well as to a method of manufacturing such a multilayer element. The invention relates, in particular, to actuators based on a piezoelectric multilayer element of which, in operation, a part is piezoelectrically active and another part is not.

An actuator of the type mentioned in the opening paragraph is disclosed in EP-A-0448349. Said actuator is built up of a number of stacked foils of a ceramic material having piezoelectric properties and of electrode layers, said foils and electrode layers being stacked so that, in operation, a part of the ceramic foils is not piezoelectrically active. The thickness of the ceramic foils employed in the known actuator is so small that when use is made of electrode layers whose dimensions correspond to those of the foils, there is a great risk of flashover between closely spaced electrode layers when the actuator is in operation. For this reason, the electrode layers between the ceramic foils in the known actuator have a smaller circumferential dimension than the ceramic foils. However, in actuators of this type having larger dimensions, this may lead to deformations during operation, because a part of the foils is not piezoelectrically active.

In EP-A-0448349, it is proposed to solve this problem by building up the actuator from sub-units, either presintered or not, between which sub-units intermediate layers of a synthetic resin material or a soldering material are provided which have the same or smaller dimensions than the electrode layers. The slits formed in this process between the edge portions of the sub-units can be filled with a filler material such as a thermocuring resin. The parts of the known actuator which, in operation, are not piezoelectrically active, only serve as electrical insulators.

From the contents of EP-A-0448349, however, it cannot be derived how a piezoelectric multilayer element of which, in operation, only a part is piezoelectrically active while the inactive part is mechanically loaded, for example for rigidly fixing it and for the transmission of motions, would have to be built up to preclude undesirable deformations in the manufacture as well as in operation, and how such a multilayer should be manufactured.

SUMMARY OF THE INVENTION

It is an object of the invention to provide a multilayer element of the type mentioned in the opening paragraph which, in operation, does not exhibit undesirable deformations and which can be manufactured in a simple manner without the development of deformations in the manufacture or in operation, and which also has advantages in other respects.

In accordance with the invention, this object is achieved by a composite multilayer element, which is characterized in that the piezoelectrically inactive part has larger dimensions in one or more directions than the part which, in operation, is piezoelectrically active when a voltage is applied across the electric connections of the element, and in that said other part is built up of ceramic foils and electrode layers whose thickness and composition correspond to the thickness and composition of the part of the element which, in operation, is piezoelectrically active.

It is noted that "built up of ceramic foils and electrode layers whose thickness and composition correspond . . . " is to be understood to mean herein that both the composition of the ceramic foils and the electrode layers and the thickness of these layers in both the piezoelectrically active and the piezoelectrically inactive part of the composite multilayer element in accordance with the invention are chosen to be such that at least the sinter behavior of both parts of the element is the same or substantially the same. Preferably, the thickness and composition of the ceramic foils and the electrode layers is the same. The difference in piezoelectric behavior can be brought about, for example, by providing electrode layers, in the part which in operation is piezoelectrically inactive, in accordance with such a pattern that, upon applying an electric voltage across the electric connections of the multilayer element, a voltage difference between the electrode layers in the inactive part is not created. To this end, the electrode layers of the inactive part are preferably interrupted in accordance with a pattern.

The parts of the element having larger dimensions, for example a larger thickness, can for example be used to rigidly fix the element in a device and to transmit motion to another part. For reasons relating to energy, the piezoelectrically active part is preferably thinner than the mechanically loaded parts which are piezoelectrically inactive.

An example of such an element is an actuator of which the rigidly fixed part has a larger thickness than the part which, in operation, is piezoelectrically active when a voltage is applied across the electric connections of the actuator. Also the part of the actuator which serves to transmit motion and which engages a part of a device which includes the actuator, can have, for example, a larger thickness and/or width than the part which, in operation, is piezoelectrically active. In actuators of this type, less energy is required to bring about a movement than in actuators of which all parts have dimensions which are actually required only to withstand mechanical forces such as clamping forces.

A composite multilayer element in accordance with the invention can be manufactured by a method which comprises the following steps:
 manufacturing a foil of a ceramic material having piezoelectric properties,
 applying electrode layers on to the foil,
 stacking a number of foils carrying electrode layers,
 pressing the stack of foils to form a green multilayer body,
 if necessary, mechanically shaping the green multilayer body, which method is characterized in accordance with the invention in that a composite piezoelectric multilayer element is manufactured by producing two or more green multilayer bodies having different shapes from ceramic foils and electrode layers of corresponding thickness and composition, and, subsequently, interconnecting them by stacking the green multilayer bodies in a suitable manner and, next, pressing, drying and sintering the composite green body thus formed, whereafter the composite multilayer element thus formed is provided with electric connections on one or more sides, said operations being carried out in such a way that, in operation, only a part of the element is piezoelectrically active when a voltage is applied across the electric connections.

To achieve the desired difference in piezoelectric behavior, the electrode layers in the piezoelectrically inactive part of the element can be provided on the ceramic foils in accordance with such a pattern that, upon application of an electric voltage across the electric connections of the finished product, a voltage difference cannot develop between the ceramic layers in the inactive part. For this purpose, the relevant electrode layers, for example, may be interrupted in accordance with a pattern.

By means of the invention, it is achieved that undesirable deformations of the element occur neither in the manufacture, for example during sintering, nor in operation. The multilayer element in accordance with the invention essentially comprises a monolithic ceramic block without intermediate layers of a material other than the ceramic material of the foils. This means that the finished multilayer element does not comprise non-ceramic connection layers, such as soldering metal, glass or synthetic resin, between the piezoelectrically active and piezoelectrically inactive parts in the finished product. This is considered to be an important advantage because it enables the green multilayer bodies assembled into an inventive element to be sintered simultaneously. In this case, no additional. steps are necessary to form the connection between the green multilayer bodies.

Research leading to the invention has revealed that the required strength and dimensional accuracy of the multilayer element cannot be obtained by mechanically reducing the dimensions of a specific part in a sintered multilayer body in one or more directions, for example by grinding out apertures or a similar action.

In accordance with a preferred embodiment of the method in accordance with the invention, one or more of the green multilayer bodies are given a suitable shape before being interconnected. This can be carried out, for example, by punching, drilling, laser shaping and the like.

In the manufacture of the composite green multilayer body, permanent or non-permanent binder layers can be provided between the individual green multilayer bodies, if necessary. Permanent binder layers must be made of a ceramic material whose composition corresponds to that of the ceramic materials of the foils from which the green multilayer bodies are built up. A non-permanent binder layer may be made, for example, from the organic binder of the ceramic material, which is burned out in the sintering operation. Surprisingly, it has been found that if the green bodies are pressed on to each other at an elevated temperature, such a binder layer is generally not necessary to obtain a proper bond between parts of the multilayer element originating from various green bodies.

In accordance with a further embodiment of the method in accordance with the invention, the composite multilayer element is divided into smaller elements, for example, by sawing, cutting with a laser or a similar action, before electric connections are provided.

These and other aspects of the invention will be apparent from and elucidated with reference to the embodiments described hereinafter.

DETAILED DESCRIPTION

Figure 1:
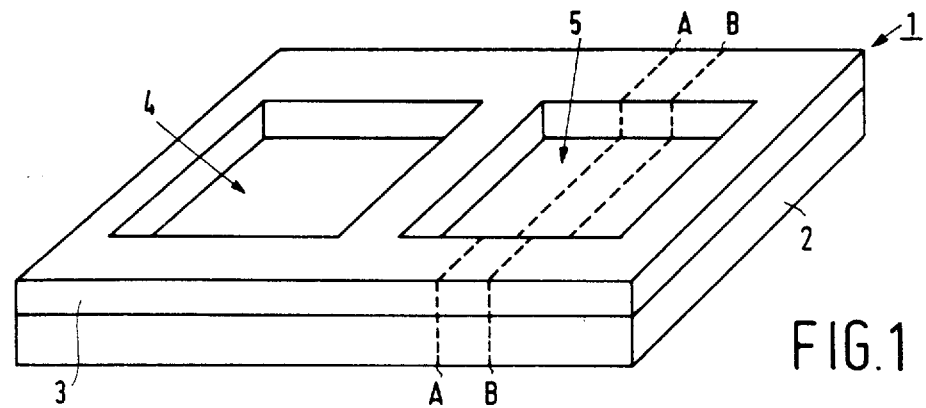
FIG. 1 is a perspective, plan view of a composite green multilayer body in accordance with the invention.

FIG. 1 shows a composite green multilayer body 1 which is composed of a green multilayer body 2 and a green multilayer body 3. Said green multilayer bodies 2 and 3, having, for example, a largest dimension of 50×50 mm and a thickness of 0.5 mm, can be manufactured by means of any method which is known per se. First, a ceramic foil of a ceramic material having piezoelectric properties is manufactured in a thickness, for example, of 20 μm. Such a foil can be obtained by suspending a quantity of powder of metal oxides, for example PbO, $TiO_2$ and $ZrO_2$, in a composition and ratio suitable for obtaining piezoelectric properties, in an alcohol, such as isopropanol. Such mixtures are known per se to those skilled in the art and do not form the subject of the invention.

The suspension thus formed is intensively ground in a ball mill for a length of time, for example 6 hours. After the grinding operation, the suspending agent is removed by drying the mixture at an elevated temperature, for example 50°–120 ° C. The dried mixture is subsequently calcined in air for 2–24 hours at 600°–1,000° C. (calcining). Subsequently, an organic binder is added to said calcined mixture. The mixture is then suspended in alcohol, for example isopropanol, and ground in a ball mill for a length of time, for example 5–20 hours. The ground suspension is subsequently used to cast a foil. After drying of the foil, an electrode layer having a thickness, for example, of 0.5–3 μm is provided on the foil by means of screen printing. For this purpose, use can be made, for example, of a conventional silver-palladium-containing screen printing paste. After drying of the paste, the foils carrying electrode layers are stacked and, subsequently, pressed to form a green multilayer body 2, for example at a pressure of 8–10 $kgf/mm^2$.

A green multilayer body 3 is obtained by manufacturing a green multilayer body in the same manner and, subsequently, providing the desired recesses or windows 4 and 5 by means of punching or otherwise. In this case, the electrode layers provided on the ceramic foil preferably exhibits patterned interruptions. The green multilayer bodies 2 and 3 are united by stacking them in a suitable manner and pressing the composite green multilayer body 1 at a pressure, for example, of 8–10 $kgf/mm^2$, at an elevated temperature, if necessary. In practice it was found that if the pressing operation was carried out at temperatures between 50° and 100° C., the presence of a binder layer between the green bodies 2 and 3 was not necessary to obtain a good adhesion. Further treatments to which the assembly is subjected include, successively, drying, calcining to remove binder residue and sintering in an oxygen-containing atmosphere at an elevated temperature, generally approximately 1,200° C. If necessary, the sintered multilayer element thus obtained can subsequently be divided into smaller elements. Subsequently, external electric connections are provided. Next, the elements are polarized in a suitable manner.

Figure 2:
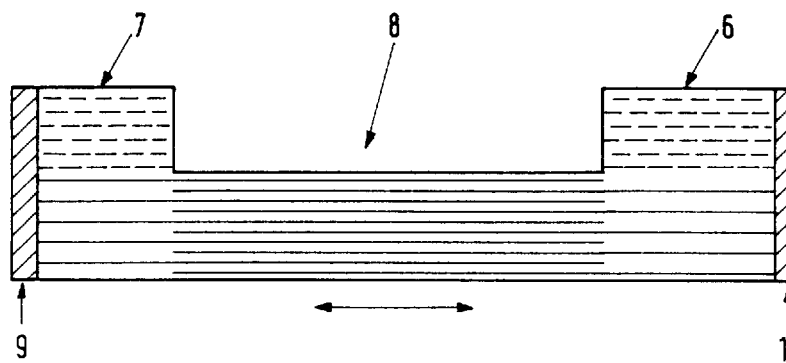
FIG. 2 is a longitudinal sectional view of a composite multilayer element in accordance with the invention, in the form of an actuator having thickened portions, FIG. 3 schematically shows another embodiment of an actuator in accordance with the invention.

FIG. 2 is a sectional view, not to scale, of an actuator in accordance with the invention. Said actuator comprises parts 6 and 7 having larger dimensions in the thickness direction, and a part 8 having a smaller dimension in the thickness direction. Part 6 can be used, for example, for rigidly fixing, and part 7 can be used to transmit a movement to another part of the construction of which the actuator forms a part. This can be, for example, a printer. The movement is brought about by the part 8, which, upon applying a voltage across the electric connections 9 and 10, is extended or shortened, dependent upon the direction of polarization and the sign of the voltage.

To focus the attention, a number of white and black layers are schematically indicated in the drawing, said white layers of the actuator indicating ceramic material and the black layers indicating electrode layers. The electrode layers of body 2 (see FIG. 1) of the element extend from one of the electric connections to the beginning of a thickened part 6 or 7 to which the other connection is secured. Said thickened parts 6 and 7 comprise a number of electrode layers which are interrupted in accordance with a pattern. Said patterned interruption precludes the development of a voltage difference between the intermediate ceramic layers when a voltage is applied across the electric connections 9 and 10. As a result, said parts 6 and 7 remain piezoelectrically inactive when a voltage is applied across the electric connections. Surprisingly, it has been found that this patterned interruption of the electrode layers, and the double thickness of the ceramic foils between the electrode layers at both ends of the multilayer element, do not give rise to deformation during sintering or in operation.

The actuator shown in a longitudinal sectional view in FIG. 2 can be obtained, for example, by dividing a sintered multilayer element, as shown in FIG. 1, into smaller elements, for example, by sawing. Two of a number of possible saw cuts are shown in FIG. 1. The part situated between the saw cuts A and B can be treated further to form an actuator as shown in FIG. 2. To this end, electric connections 9 and 10 in the form of metal layers, for example of gold, are provided on the element by means of vacuum evaporation, chemical vapor deposition, sputtering or the like. The electric connections 9 and 10 are connected to the electrode layers, which are situated between the ceramic foils in part 8. Subsequently, the element is polarized in such a manner that, upon applying a voltage across the electrode layers 9 and 10, part 8 is extended or shortened only in the directions indicated by the arrow. If the distance between the parts 6 and 7 is approximately 5 mm, for example, a reduction in length of 2.5 μm can be obtained by applying a suitable voltage across the electric connections 9 and 10. In this case, the piezoelectrically active part 8 may have a thickness, for example, of 0.5 mm and a length of 5 mm, the thickened, inactive parts 6 and 7 may each have a thickness of 0.9 mm and a length of 2.5 mm.

Figure 3:
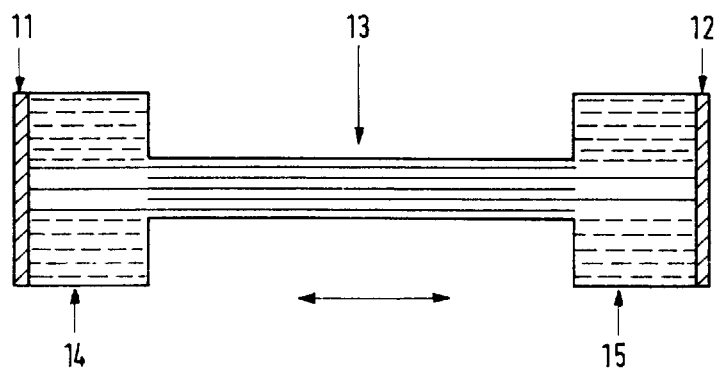

FIG. 3 is a schematic, side view (not to scale) of another embodiment of an actuator in accordance with the invention. This actuator can be obtained by connecting a green body 2, as shown in FIG. 1, to a green body 3 on both sides and subsequently carrying out the same operations as in the manufacture of the actuator shown in FIG. 2. When a voltage is applied across the electric connections 11 and 12, a piezoelectric effect in the form of an extension or contraction occurs only in the part 13 between the thickened parts 14 and 15.

Figure 4:
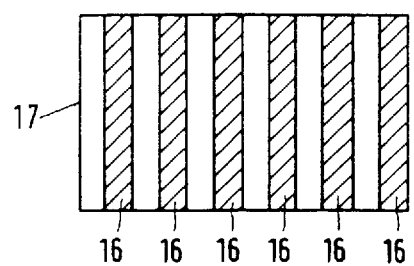
FIG. 4 is a schematic, plan view of a foil having an electrode layer which is interrupted in accordance with a pattern.

FIG. 4 is a plan view of a ceramic foil 17 on which an electrode layer 16 having patterned interruptions is provided. This can be used to build up a green body 3, as shown in FIG. 1, which green body is utilized to manufacture the piezoelectrically inactive parts of the actuators shown in FIGS. 2 and 3.

What is claimed is:

1. A composite piezoelectric multilayer element of which, in operation, only a part is piezoelectrically active, characterized in that the piezoelectrically inactive part has a larger dimension in a direction normal to the layers than the part which, in operation, is piezoelectrically active when a voltage is applied across the electric connections of the element, and in that the inactive part is built up of ceramic foils and electrode layers whose thickness and composition correspond to the thickness and composition of the part of the element which, in operation, is piezoelectrically active.

2. A composite piezoelectric multilayer element as claimed in claim 1, characterized in that the thickness and composition of the ceramic foils and of the electrode layers is the same in the piezoelectrically active part and in the piezoelectrically inactive part.

3. A composite piezoelectric multilayer element as claimed in claim 1, characterized in that in the part which, in operation, is piezoelectrically inactive, electrode layers are interrupted in accordance with a pattern, so that a voltage difference between the electrode layers in the inactive part is not created when a voltage is applied across the electric connections of the multilayer element.

4. A composite piezoelectric multilayer element as claimed in claim 1, characterized in that a permanent binder layer is interposed between the piezoelectrically active part and the piezoelectrically inactive part, consists exclusively of a ceramic material which corresponds to the ceramic material of the foils in the active part and the inactive part.

* * * * *